(12) United States Patent
Smorchkova et al.

(10) Patent No.: US 7,750,370 B2
(45) Date of Patent: Jul. 6, 2010

(54) HIGH ELECTRON MOBILITY TRANSISTOR HAVING SELF-ALIGNED MINIATURE FIELD MITIGATING PLATE ON A PROTECTIVE DIELECTRIC LAYER

(75) Inventors: Ioulia Smorchkova, Lakewood, CA (US); Robert Coffie, Camarillo, CA (US); Ben Heying, Fullerton, CA (US); Carol Namba, Walnut, CA (US); Po-Hsin Liu, Anaheim, CA (US); Boris Hikin, Los Angeles, CA (US)

(73) Assignee: Northrop Grumman Space & Mission Systems Corp., Los Angeles, CA (US)

( * ) Notice: Subject to any disclaimer, the term of this patent is extended or adjusted under 35 U.S.C. 154(b) by 50 days.

(21) Appl. No.: 12/003,098

(22) Filed: Dec. 20, 2007

(65) Prior Publication Data

US 2009/0159930 A1    Jun. 25, 2009

(51) Int. Cl.
*H01L 29/778* (2006.01)
*H01L 21/338* (2006.01)
(52) U.S. Cl. ................ 257/194; 257/201; 257/E29.246
(58) Field of Classification Search ................. 257/183, 257/192, 200–201, 194, E29.246
See application file for complete search history.

(56) References Cited

U.S. PATENT DOCUMENTS

| | | | |
|---|---|---|---|
| 5,053,348 A | 10/1991 | Mishra et al. | |
| 5,288,660 A | 2/1994 | Hua et al. | |
| 5,300,445 A | 4/1994 | Oku | |
| 5,312,765 A | 5/1994 | Kanber | |
| 5,358,878 A | 10/1994 | Suchet et al. | |
| 5,496,779 A | 3/1996 | Lee et al. | |
| 5,930,610 A | 7/1999 | Lee | |
| 6,646,293 B2 | 11/2003 | Emrick et al. | |
| 6,717,271 B2 * | 4/2004 | Makiyama et al. | 257/773 |
| 6,806,204 B1 | 10/2004 | Zheng et al. | |
| 7,005,717 B2 | 2/2006 | Eisenbeiser et al. | |
| 7,045,404 B2 | 5/2006 | Sheppard et al. | |
| 7,534,672 B1 * | 5/2009 | Milosavljevic et al. | 438/182 |
| 2002/0190270 A1 | 12/2002 | Emrick | |
| 2003/0017722 A1 | 1/2003 | Emrick | |
| 2003/0075719 A1 * | 4/2003 | Sriram | 257/77 |
| 2004/0021152 A1 | 2/2004 | Nguyen et al. | |
| 2005/0051796 A1 | 3/2005 | Parikh et al. | |
| 2005/0258451 A1 * | 11/2005 | Saxler et al. | 257/192 |
| 2006/0138456 A1 | 6/2006 | Parikh et al. | |
| 2006/0249750 A1 | 11/2006 | Johnson et al. | |
| 2007/0018199 A1 | 1/2007 | Sheppard et al. | |
| 2007/0018210 A1 | 1/2007 | Sheppard | |
| 2007/0128752 A1 | 6/2007 | Shim et al. | |
| 2007/0158683 A1 * | 7/2007 | Sheppard et al. | 257/183 |
| 2007/0164321 A1 * | 7/2007 | Sheppard et al. | 257/256 |
| 2007/0205433 A1 | 9/2007 | Parikh et al. | |

\* cited by examiner

*Primary Examiner*—Anh D Mai
(74) *Attorney, Agent, or Firm*—Posz Law Group, PLC

(57) ABSTRACT

A semiconductor device is fabricated to include source and drain contacts including an ohmic metal sunken into the barrier layer and a portion of the channel layer; a protective dielectric layer disposed between the source and drain contacts on the barrier layer; a metallization layer disposed in drain and source ohmic vias between the source contact and the protective dielectric layer and between the protective dielectric layer and the drain contact; and a metal T-gate disposed above the barrier layer including a field mitigating plate disposed on a side portion of a stem of the metal T-gate.

7 Claims, 6 Drawing Sheets

HIGH ELECTRON MOBILITY TRANSISTOR HAVING SELF-ALIGNED MINIATURE FIELD MITIGATING PLATE ON A PROTECTIVE DIELECTRIC LAYER

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Government Contract Number N00014-05-C-0121 awarded by the Office of Naval Research, Department of the Navy.

CROSS-REFERENCE TO RELATED APPLICATIONS

The present application is related to and incorporates by reference the contents of U.S. application Ser. No. 11/976,590 to Smorchkova et al. filed on Oct. 25, 2007.

TECHNICAL FIELD

The technical field relates generally to a semiconductor device and a fabrication method therefore, and, more particularly, to a semiconductor device operational at microwave and mm-wave frequencies.

BACKGROUND

Wide band gap semiconductors such as a Group III nitrides offer a number of superior properties that make them very attractive for a number of electronic applications. In particular, high electric field breakdown strengths, high current carrying capabilities and high electron saturation velocities allow nitride-based High Electron Mobility Transistors (HEMTs) to provide very high voltage and high power operation at microwave and mm-wave frequencies.

In order to promote wide scale adoption of this technology, Group III nitride HEMTs must satisfy certain minimum power performance requirements and a minimum operation time duration before power degradation. One particular aspect that has limited the device performance and device lifetime has been the presence of high electric fields in these structures that lead to increased charge trapping and excessive gate leakage. These field dependent mechanisms can be significant obstacles to achieving the required device performance and stability.

It would be desirable to have a semiconductor device fabrication process that could minimize field dependent degradation mechanisms and enable the manufacture of HEMT devices suitable for reliable microwave and mm-wave frequency operation. It would be further desirable for such a semiconductor fabrication process to also satisfy the production efficiency and complexity levels of current semiconductor device fabrication processes. It would be further desirable for such a semiconductor fabrication process to have repeatability and robustness in a manufacturing environment.

SUMMARY

A protective dielectric layer can be grown on a semiconductor surface by molecular beam epitaxy (MBE) or another thin film deposition technique to protect the semiconductor surface during fabrication process and to minimize surface trap formation. Nitride high electron mobility transistors (HEMTs) processed with such protective dielectric layers have demonstrated superior performance and reliability due to reduced trap formation on the semiconductor surface. A gate connected field plate has also demonstrated effective electric field reduction on the drain side of the gate, thereby improving device reliability by reducing electric field dependent phenomena such as electron trapping and gate leakage and increasing device electrical breakdown.

In Nitride HEMTs processed with the above-described protective dielectric layer, the ohmic and Schottky contacts have to be formed by etching through substantially all of the protective layer, thereby adding further complexity to the fabrication process. Accordingly, it is a concern of the present disclosure to develop a HEMT fabrication process with a self-aligned field-mitigating plate that is compatible with the protective layer technology for reliable device operation at mm-wave frequencies.

Accordingly, a method of forming a HEMT according to an embodiment includes forming a protective dielectric layer on the semiconductor substrate; forming drain and source ohmic vias in the protective dielectric layer; and depositing ohmic metal into the drain and source ohmic vias to form drain and source contacts.

The ohmic metal is preferably deposited into predetermined portions of the drain and source ohmic vias so that ohmic via gaps remain in the drain and source ohmic vias between the deposited ohmic metal and the protective dielectric layer. The ohmic metal is then annealed at a predetermined temperature and additional metallizations are subsequently deposited in the ohmic via gaps. The ohmic via gap metallizations mitigate potential charge trapping in the etched regions of the protective dielectric layer.

A resist layer is formed on the protective dielectric layer and the drain and source contacts, and a resist opening is formed in the resist layer by, for example, EBL. A predetermined portion of the protective dielectric layer is etched via the resist opening to form a window in the protective dielectric layer. The resist opening is then widened so that a width of a lower portion of the resist opening is greater than a width of the window in the protective dielectric layer. A metal is deposited in the window and on the resist layer. Then, the resist layer is lifted off to form a T-gate and a field mitigating plate disposed at a side portion of the T-gate.

In a variation to the above embodiment, the protective dielectric layer can be composed of several layers: a first dielectric layer; an etch-stop layer and a second dielectric layer. The ohmic contact formation process in this case is similar to the one described above. To form a gate, the resist layer is deposited on the second dielectric layer. A predetermined portion of the second dielectric layer is etched via the resist opening down to the etch stop layer to form the window in the second dielectric layer. The etch stop layer can subsequently be removed as well if necessary. Similar to the above embodiment, the resist opening is then widened so that a width of a lower portion of the resist opening is greater than a width of the window in the second dielectric layer. A metal is deposited in the window and on the resist layer. Then, the resist layer is lifted off to form a T-gate sitting on the first dielectric layer or on the etch stop layer and a field mitigating plate disposed at a side portion of the T-gate.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

Various embodiments of a semiconductor device and a fabrication method thereof will be discussed with reference to the drawings in which like numbers reference like components, and in which a single reference number may be used to identify an exemplary one of multiple like components.

Referring to FIGS. 1A-1H, a semiconductor device fabrication method for forming a high electron mobility transistor (HEMT) or heterostructure field effect transistor (HFET), both of which will be collectively referred to here as HEMT, operable at microwave and mm-wave frequencies having a T-gate including a miniature field mitigating plate for reducing the electric fields on the semiconductor surface will be discussed.

Figure 1A:
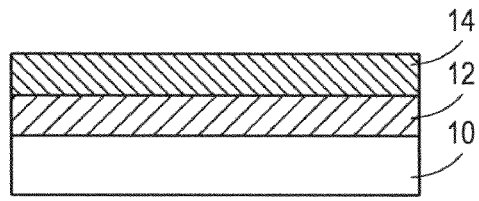
FIGS. 1A-1H are diagrams illustrating a semiconductor device fabrication method according to an embodiment.

Referring to FIG. 1A, the HEMT includes a semi-insulating substrate such as, for example, a silicon carbide (SiC) substrate not shown for ease of illustration, a channel layer 10 which can be composed of gallium nitride (GaN), and an electron supply or barrier layer 12 which can be composed of aluminum gallium nitride (AlGaN). As those skilled in the art should appreciate, electrons from the barrier layer 12 transfer into the channel layer 10 and form a two-dimensional electron gas (2-DEG) channel for carrying current between a source region and a drain region.

A protective dielectric layer 14 is deposited on the barrier layer 12 by, for example, molecular beam epitaxy (MBE) or another thin film deposition technique such as plasma enhanced chemical vapor deposition (PECVD), low-pressure chemical vapor deposition (LPCVD), sputtering or atomic layer deposition (ALD) to protect the semiconductor surface during fabrication and to minimize trap formation. The protective dielectric layer 14 preferably includes silicon nitride (SiN); however, it can include other insulating materials such as aluminum nitride (AlN), silicon dioxide ($SiO_2$) or aluminum oxide ($Al_2O_3$).

Figure 1B:
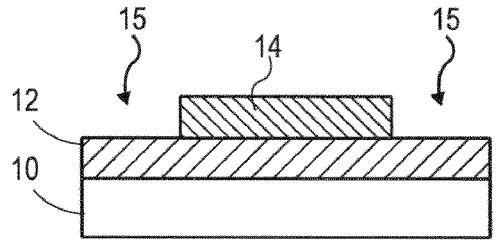
Figure 1C:
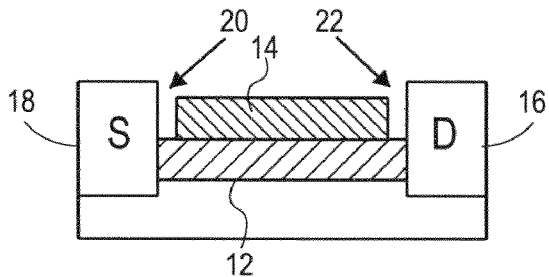

Referring to FIG. 1B, drain and source ohmic vias 15 are formed by etching predetermined portions of the protective dielectric layer 14 by either wet or dry etching techniques. Referring to FIG. 1C, an ohmic metal is deposited in predetermined portions of the drain and source ohmic vias 15 to form drain and source ohmic contacts 16, 18 to the drain and source regions such that predetermined gaps, which will be referred to here as ohmic via gaps 20, 22, remain in the drain and source ohmic vias 15 between the deposited ohmic metal and the protective dielectric layer 14.

The contacts 16, 18 can be formed by patterning the ohmic vias 15 and the protective dielectric layer 14 with photoresist by conventional photolithography techniques and depositing the ohmic metal over the patterned photoresist. The ohmic metal is preferably a low resistive material such as, for example, a stack of titanium, aluminum, nickel and gold layers and is deposited by, for example, an evaporation process in which the metal or combination thereof is heated to the point of vaporization and then evaporated to form the ohmic metal in the vias 15.

The patterned photoresist can then be lifted off so that portions of the ohmic metal remain on the barrier layer 12. The ohmic metal is then annealed at a predetermined temperature such as 800-900 degrees Celsius so that a portion thereof sinks into the channel layer 10 to thereby form drain and source contacts 16, 18 with the drain and source regions. The ohmic via gaps 20, 22 between the contacts 16, 18 and the protective dielectric layer 14 prevent the ohmic metal for the contacts 16, 18 from flowing onto the protective dielectric layer 14 during the annealing.

Figure 1D:
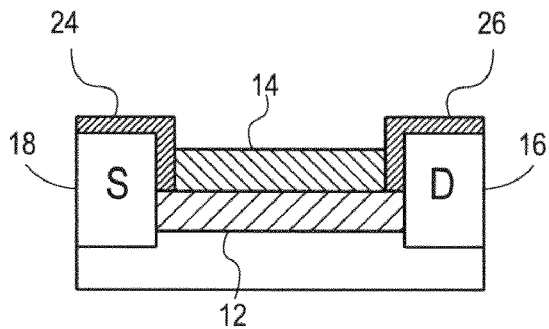

Referring to FIG. 1D, additional metallizations 24, 26 are deposited in the ohmic vias gaps 20, 22 and on the annealed drain and source contacts 16, 18 also by conventional photolithography techniques. The additional metallizations can be metals similar to or different from ohmic metals of the contacts 16, 18. The additional metallizations 24, 26 mitigate possible charge trapping in the ohmic via gaps 20, 22 and minimize radio-frequency (RF) dispersion.

Figure 1E:
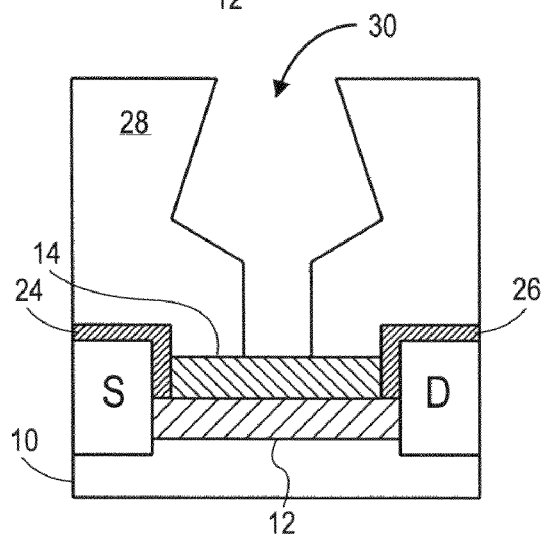

Referring to FIG. 1E, an electron beam (e-beam) lithography (EBL) resist layer 28 is formed on the metallizations 24, 26 and the protective dielectric layer 14. The resist layer 28 can be, for example, a two-layer resist film composed of polymethylmethacrylate (PMMA) film and a copolymer film formed on the PMMA film. However, the resist layer 28 is not limited to PMMA and copolymer, and may be composed of, for example, other electron beam sensitive resists such as polydimethylglutarimide (PMGI), ZEP 520, ZEP 7000, etc.

The resist layer 28 can be formed by, for example, depositing the PMMA film and copolymer film successively on the metallizations 24, 26 and the protective dielectric layer 14 while the layered structure is spinning at a high speed. However, any resist formation process can be used as long as it results in a substantially even coat of the resist layer 28. Subsequently, the EBL resist layer 28 can be soft-baked to drive out traces of solvent.

EBL is applied to the resist layer 28 to form a resist opening 30 having a profile in which the width is comparatively narrow in a lower portion and comparatively greater in an upper portion. For example, the e-beam can be applied directly (direct writing) to the resist layer 28 to form the resist opening 30. Alternatively, a self-supporting mask can be used with a flood electron gun source which provides a collimated beam of electrons. The mask can then be imaged directly on the resist layer 28 to thereby form the window 30. Alternatively, optical lithography utilizing bi-layers of various photoresists can be used for the patterning process.

Figure 1F:
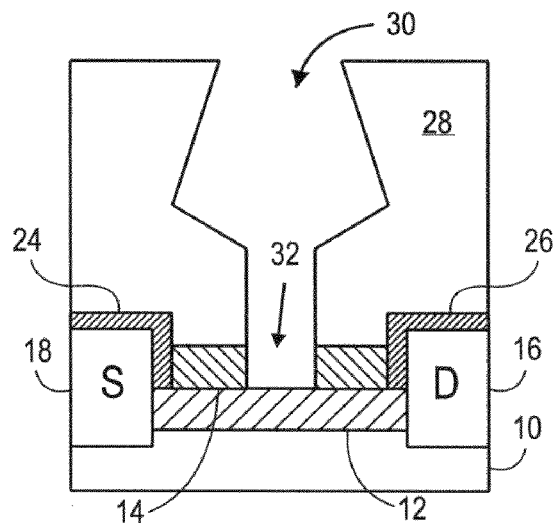

Referring to FIG. 1F, a predetermined portion of the protective dielectric layer 14 is completely or partially etched via the resist opening 30 to form a window 32 in the protective dielectric layer 14. An anisotropic dry etch is preferably used so that the resist layer 28 and the predetermined portion of the protective dielectric layer 14 are etched vertically while the lateral etch rates of both layers remain negligible. The final size of window 32 is therefore very close to the original (pre-etch) size of the resist opening 30 in its lower portion.

Figure 1G:
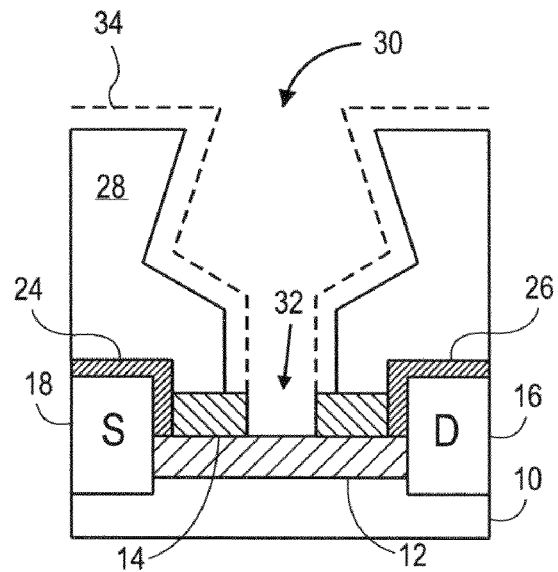

Referring to FIG. 1G, the resist opening 30 is widened so that a width of a lower portion of the resist opening 30 is greater than a width of the window 32 in the protective dielectric layer 14. The widening can be achieved by performing a post-etch oxygen descum on the resist opening 30 so that only the resist opening 30 is widened while a width of the window 32 in the protective dielectric layer 14 is not substantially effected. The dashed line 34 depicts the pre-descum resist profile while the solid line represents the resist profile after oxygen descum. Widening the resist opening 30 with respect to the window 32 permits formation of miniature wings on both sides of the T-gate. The wing on the drain side of the gate 36 can serve as a miniature gate-connected field mitigating plate.

A metal film is deposited on the resist layer 28, in the resist opening 30 and in the window 32 by, for example, an evaporation process in which a metal such as titanium (Ti), nickel (Ni), palladium (Pd), platinum (Pt), molybdenum (Mo), tungsten (W), gold (Au) or a combination thereof is heated to the point of vaporization and then evaporated to form the metal film.

Figure 1H:
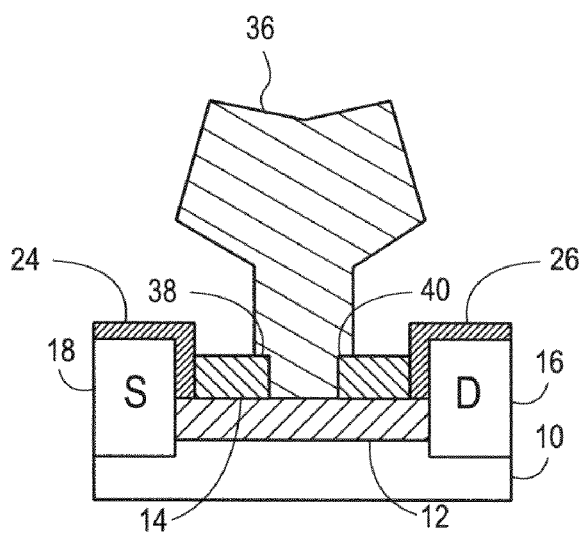

The resist layer 28 is then lifted off from the metallizations 24, 26 and the protective dielectric layer 14 to thereby form a metal T-gate 36 and miniature metal plates 38, 40 disposed at side portions of the T-gate as shown in FIG. 1H. The metal T-gate 36 serves as a Schottky barrier gate for modulating the sheet concentration of accumulated electrons. The miniature metal plate 40 can serve as a field mitigating plate which provides electric field reduction on the drain side of the metal T-gate.

The resist layer 28 can be lifted off by, for example, application of a liquid stripper or chemical solvent such as, for example, acetone or methylethylketone, or by oxidizing the resist layer 28 in an oxygen plasma system. Evaporation of the metal film and lifting off of the resist layer 28 results in the metal T-gate 36 having a mushroom-like shape with a wide portion referred to as a wing portion on top and a thin portion referred to as a gate stem on the bottom, with the miniature plates 38, 40 disposed at side portions of the gate stem. The lateral dimensions of the plates 38, 40 are controlled by the lateral resist etch rate during the post-etch descum. The vertical separation between the plates 38, 40 and the surface of the barrier layer 12 is approximately equal to the thickness of the protective dielectric layer 14. The gate footprint or gate length (Lg) is determined by the window 32 in the protective dielectric layer 14. The T-gate can have a length ($L_g$) less than 0.25 micrometers and the plates 38, 40 can have a length ($L_{FP}$) less than 50 nanometers. The protective dielectric layer 14 can have a thickness of, for example, 20 nm.

Figure 2:
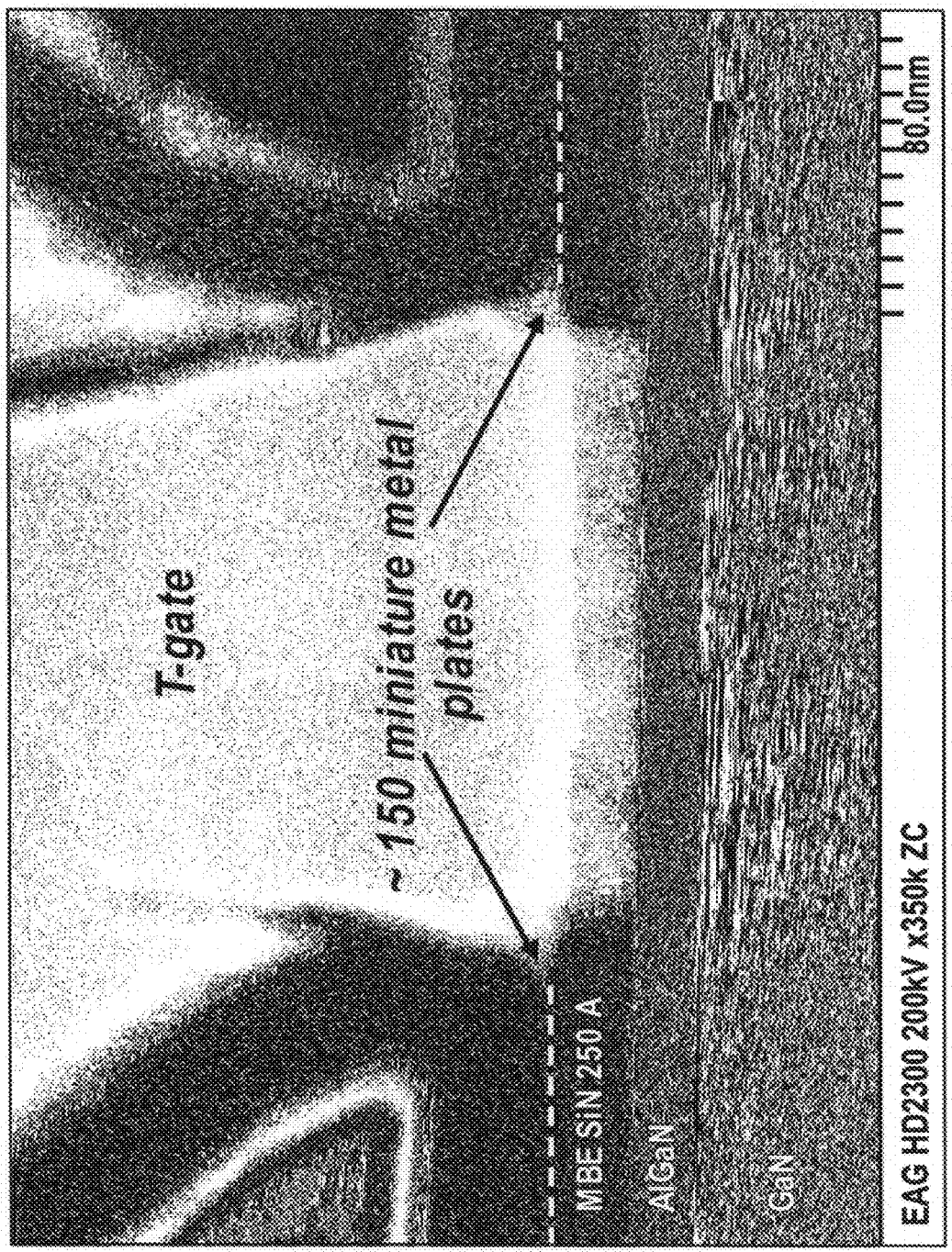
FIG. 2 is a cross-sectional scanning electron micrograph image showing gate and field plate portions of an exemplary semiconductor device fabricated according to the embodiment.

Thereby, the novel semiconductor fabrication method shown in FIGS. 1A-1H can form a HEMT having self-aligned miniature field mitigating plate 40 disposed on the protective dielectric layer 14 for reducing the electric field at the surface and thereby improving devices reliability. An advantage of the above-described fabrication process is that the metal T-gate 36 and the field mitigating plate 40 can be formed simultaneously. Further, the field plate dimensions can be minimized to less than 50 nm, thereby allowing high device performance at mm-wave frequencies. As shown in FIG. 2, a scanning transmission electron micrograph (STEM) image of a semiconductor device fabricated according to the above process confirms the presence of miniature metal plates with lengths of approximately 150 Angstroms at side portions of the metal T-gate. Another key feature of the described process is ohmic via gap metallization that mitigates potential charge trapping in the etched portions of the protective dielectric layer.

Figure 3:
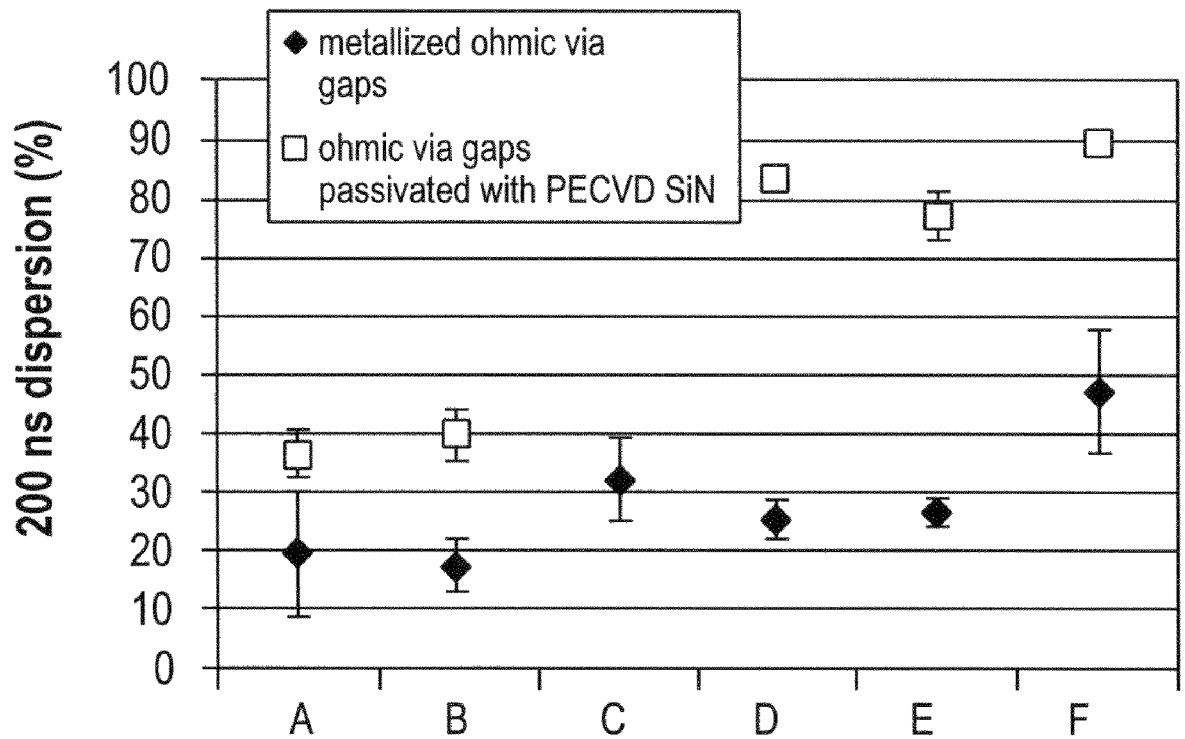
FIG. 3 is a diagram illustrating the radio-frequency (RF) dispersion for exemplary semiconductor devices fabricated according to the embodiment and related art semiconductor devices.

Referring to FIG. 3, the radio-frequency (RF) dispersion for exemplary semiconductor devices fabricated according to the fabrication process shown in FIGS. 1A-1H was compared with that of related art semiconductor devices within several semiconductor wafers A-F. The RF dispersion or device current collapse under pulsed operation is typically caused by electron trapping on the surface or within the semiconductor structure. In FIG. 3, the RF dispersion is expressed as a percentage change between the DC and the pulsed current at Vds=5 V and Vg=+1 V. The pulsing was performed from the high field regime of Vds=20V and Vg=−8 V with the 200 ns pulse duration. The exemplary semiconductor devices include the metallizations 24, 26 disposed in the ohmic via gaps 15 between the protective dielectric layer 14 and the drain and source contacts 16, 18. In comparison, the ohmic via gaps of the related art semiconductor devices were filled with passivating SiN by PECVD. As shown, the semiconductor devices which included the metallizations 24, 26 demonstrated significantly reduced RF dispersion in comparison to the related art semiconductor devices.

Figure 4A:
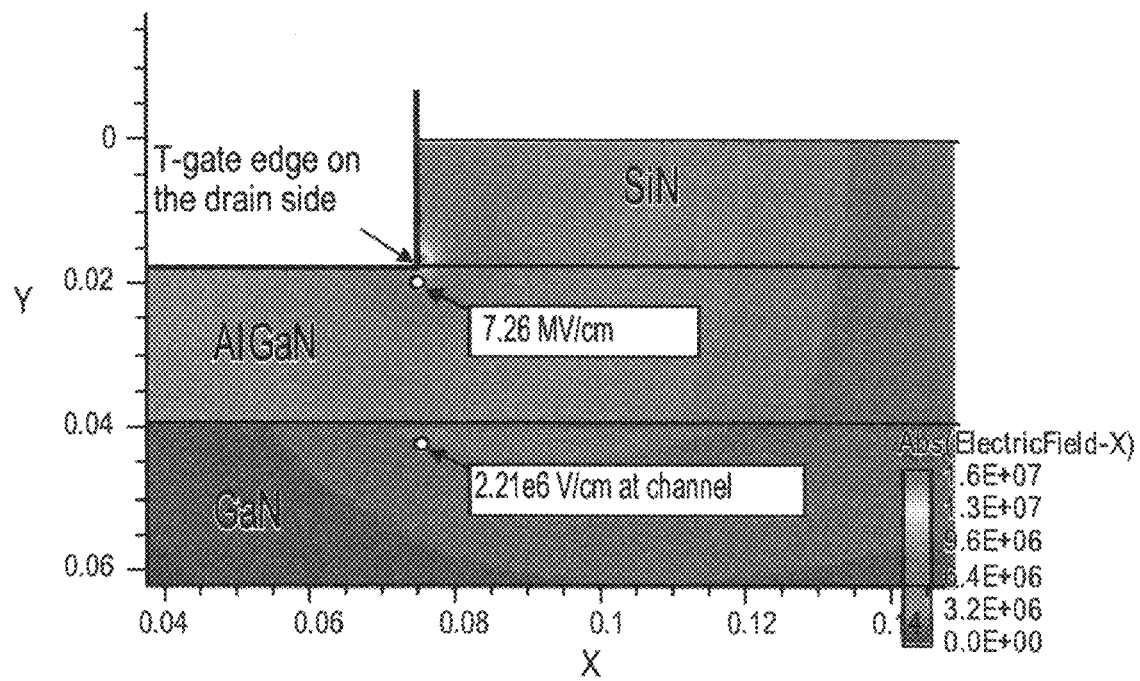
FIG. 4A is a diagram illustrating simulated surface electric fields for a related art semiconductor device including a conventional T-gate.
Figure 4B:
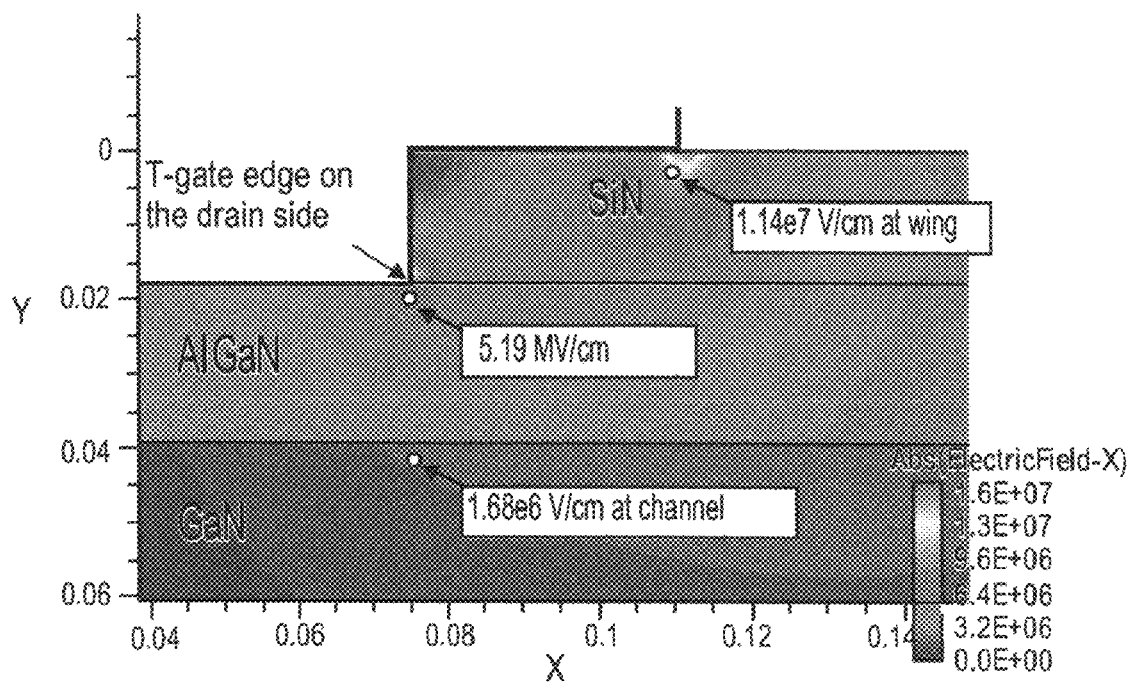
FIG. 4B is a diagram illustrating simulated surface electric fields for a semiconductor device fabricated according to the embodiment.

Referring to FIGS. 4A-4B, the electric fields for a related art semiconductor device including a conventional T-gate and a semiconductor device including the T-gate 36 with the miniature field mitigating plate 40 were simulated. In both cases, the protective dielectric layer included SiN having a thickness of 175 Angstroms and the length of the gate ($L_g$) was 0.15 micrometers. The simulation conditions for the measurements were: Vds=25 V and Vgs=−7 V. The length of the field mitigating plates ($L_{FP}$) was 350 Angstroms.

The T-gate only semiconductor device had electric fields of approximately 7.26 MV/cm at the T-gate edge on the drain side and 2.21 MV/cm at the channel. In comparison, the T-gate with miniature field mitigating plate semiconductor device had electric fields of approximately 5.19 MV/cm at the T-gate edge on the drain side and 1.68 MV/cm at the channel. That is, a 350 Angstrom miniature field plate provided nearly 2 MV/cm electric field reduction at the drain edge of the T-gate at the AlGaN barrier layer surface.

Figure 5:
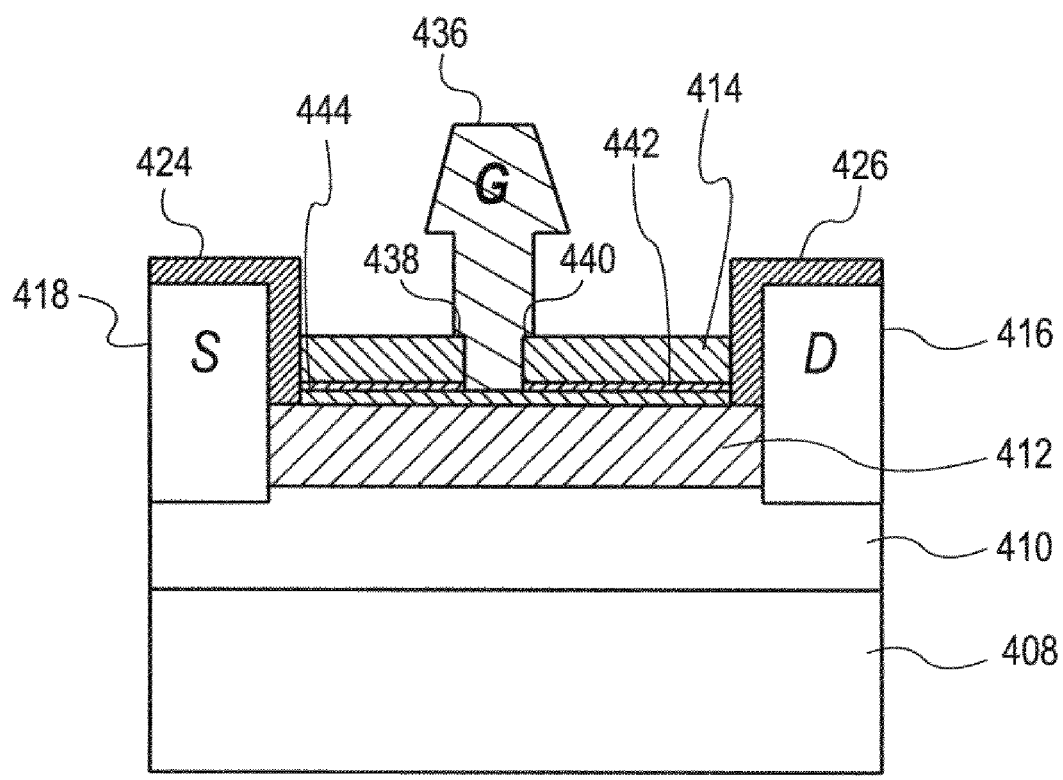
FIG. 5 is a diagram illustrating an exemplary semiconductor device fabricated according to a variation of the embodiment.

Referring to FIG. 5, an exemplary semiconductor device in accordance with a variation to the above embodiment will be discussed. Although not shown, the semiconductor device includes a semi-insulating substrate, which is preferably a SiC substrate, and a nucleation layer, which is preferably composed of aluminum nitrite (AlN), disposed above the semi-insulating substrate. A buffer layer or back-barrier layer 408, which is preferably composed of gallium nitrite (GaN) or aluminum gallium nitrite (AlGaN) can be disposed above the nucleation layer. A channel layer 410 is disposed above the buffer layer or a back-barrier layer 408, and a barrier layer 412 is disposed above the channel layer 410.

In a variation to the above embodiment, the protective dielectric layer is a composite protective dielectric layer which includes a first dielectric layer 444, an etch-stop layer 442, and a second dielectric layer 414 disposed above the barrier layer 412. The second dielectric layer 414 is etched under the gate so that only the first dielectric layer 444 and the etch-stop layer 442 or just the first protective dielectric layer 444 remain under the gate.

The composite protective dielectric coating composed of layers 444, 442 and 414 protects the semiconductor surface from the processing environment, thereby reducing surface damage and minimizing trap formation. The etch-stop layer 442 allows anisotropic dry etching through the second dielectric 414 without destroying layers 444 and 442. The dielectric layer 444 or a combination of layers 444 and 442 under the gate has the further advantage of reducing device gate leakage.

The layers 444, 442 and 414 can be formed by successively coating the barrier layer 412 with SiN (dielectric material), AlN (etch-stop material), and SiN by MBE. Exemplary dimensions include 3.5 nm for the first dielectric layer and 20 nm for the second dielectric layer.

The apparatuses and methods discussed above and the inventive principles thereof are intended to and will manufacture a semiconductor device with minimized charge trapping effects due to the use of protective dielectric layer, ohmic via gap metallization and field mitigating plate. The field mitigating plate can be 50 nanometers or smaller and still provide the reduced electric field benefit.

It is expected that one of ordinary skill given the above described principles, concepts and examples will be able to implement other alternative procedures and constructions that offer the same benefits. It is anticipated that the claims below cover many such other examples.

The invention claimed is:

1. A high electron mobility transistor (HEMT), comprising:
   a semi-insulating substrate;
   a channel layer disposed on the substrate;
   a barrier layer disposed over the channel layer;
   drain and source contacts including an annealed ohmic metal sunken into the barrier layer and a portion of the channel layer;
   a protective dielectric layer disposed between the drain and source contacts on the barrier layer;
   metallizations disposed on the drain and source contacts and in drain and source ohmic vias between the source contact and the protective dielectric layer and between the protective dielectric layer and the drain contact; and
   a metal T-gate disposed above the barrier layer including a field mitigating plate disposed on a side portion of a stem of the metal T-gate and directly above and contacting a portion of the protective dielectric layer adjacent to the side portion of the stem of the metal T-gate.

2. The HEMT of claim 1, wherein
the channel layer comprises gallium nitride (GaN) and the barrier layer comprises aluminum gallium nitride (AlGaN).

3. The HEMT of claim 1, wherein
a length of the metal T-gate is less than 0.25 micrometers.

4. The HEMT of claim 1, wherein
a length of the field mitigating plate is less than 50 nanometers.

5. The HEMT of claim 1, wherein
the protective dielectric layer further includes:
a first dielectric layer disposed on the barrier layer;
an etch-stop layer disposed on the first dielectric layer; and
a second dielectric layer disposed on the etch-stop layer; wherein
   the metal T-gate is further disposed so as to extend through the second dielectric layer and the etch stop layer,
   the first dielectric layer is under the metal T-gate, and
   the field mitigating plate is disposed directly above and contacts a portion of the second dielectric layer adjacent to the side portion of the stem of the metal T-rate.

6. The HEMT of claim 1, wherein
the protective dielectric layer further includes:
a first dielectric layer disposed on the barrier layer;
an etch-stop layer disposed on the first dielectric layer; and
a second dielectric layer disposed on the etch-stop layer; wherein
   the metal T-gate is further disposed so as to extend through the second dielectric layer
   the etch stop layer and the first dielectric layer are under the metal T-gate, and
   the field mitigating plate is disposed directly above and contacts a portion of the second dielectric layer adjacent to the side portion of the stem of the metal T-gate.

7. The HEMT of claim 1, wherein
the annealed ohmic metal sunken into the barrier layer and a portion of the channel layer is a different metal from the metallizations disposed on the drain and source contacts and in the drain and source ohmic vias.

* * * * *